United States Patent
Moriceau et al.

(10) Patent No.: US 7,776,714 B2
(45) Date of Patent: Aug. 17, 2010

(54) METHOD FOR PRODUCTION OF A VERY THIN LAYER WITH THINNING BY MEANS OF INDUCED SELF-SUPPORT

(75) Inventors: Hubert Moriceau, Saint Egreve (FR); Chrystelle Lagahe, St. Joseph de Riviere (FR); Benoit Bataillou, Barby (FR)

(73) Assignee: Commissariat A l'Energie Atomique, Paris (FR)

( * ) Notice: Subject to any disclaimer, the term of this patent is extended or adjusted under 35 U.S.C. 154(b) by 609 days.

(21) Appl. No.: 10/558,621

(22) PCT Filed: Jun. 3, 2004

(86) PCT No.: PCT/FR2004/050212

§ 371 (c)(1),
(2), (4) Date: Nov. 28, 2005

(87) PCT Pub. No.: WO2004/112125

PCT Pub. Date: Dec. 23, 2004

(65) Prior Publication Data

US 2007/0020895 A1    Jan. 25, 2007

(30) Foreign Application Priority Data

Jun. 6, 2003    (FR)    .................................. 03 50207

(51) Int. Cl.
*H01L 21/30* (2006.01)
(52) U.S. Cl. .................. 438/455; 438/458; 438/510; 257/E21.122; 257/E21.568
(58) Field of Classification Search ................. 438/455, 438/458, 510; 257/E21.122, E21.568
See application file for complete search history.

(56) References Cited

U.S. PATENT DOCUMENTS 5,714,395 A * 2/1998 Bruel ......................... 438/528
5,953,622 A   9/1999 Lee et al.
6,146,979 A * 11/2000 Henley et al. ............... 438/458

(Continued)

FOREIGN PATENT DOCUMENTS

WO   00/48278   8/2000

OTHER PUBLICATIONS

M. Bruel, "Silicon on insulator material technology", Electronics Letters, vol. 31, No. 14, pp. 1201-1202 Jul. 6, 1995.

*Primary Examiner*—Charles D Garber
*Assistant Examiner*—Stanetta D Isaac
(74) *Attorney, Agent, or Firm*—Oblon, Spivak, McClelland, Maier & Neustadt, L.L.P.

(57)    ABSTRACT

The invention relates to a process for obtaining a thin layer made of a first material on a substrate made of a second material called the final substrate, including the following steps:
  bonding a thick layer of a first material on one of its main faces on the final substrate at an interface,
  implantation of gaseous species in the thick layer of first material to create a weakened zone delimiting said thin layer between the interface and the weakened zone,
  deposit a layer of third material called the self-supporting layer on the thick layer made of first material,
  fracture within the structure composed of the final substrate, the thick layer of first material and the layer of third material, at the weakened zone to supply the substrate supporting said thin layer.

20 Claims, 3 Drawing Sheets

U.S. PATENT DOCUMENTS

| | | | |
|---|---|---|---|
| 6,246,068 B1 * | 6/2001 | Sato et al. ....................... 257/3 |
| 6,335,258 B1 | 1/2002 | Aspar et al. |
| 6,420,243 B1 * | 7/2002 | Stanley et al. ............... 438/458 |
| 6,566,158 B2 * | 5/2003 | Eriksen et al. ................ 438/53 |
| 6,569,748 B1 * | 5/2003 | Sakaguchi et al. .......... 438/455 |
| 6,770,507 B2 * | 8/2004 | Abe et al. ..................... 438/64 |
| 7,115,481 B2 * | 10/2006 | Ghyselen et al. ............ 438/458 |
| 7,226,509 B2 * | 6/2007 | Faure .......................... 117/95 |
| 2002/0019118 A1 | 2/2002 | Chan |

* cited by examiner

METHOD FOR PRODUCTION OF A VERY THIN LAYER WITH THINNING BY MEANS OF INDUCED SELF-SUPPORT

TECHNICAL DOMAIN

This invention relates to a process for obtaining a thin layer on a substrate, particularly for obtaining a very thin layer, typically less than 0.1 μm.

It is particularly applicable to the production of an SOI type structure.

STATE OF PRIOR ART

Document FR-A-2 681 472 (corresponding to American U.S. Pat. No. 5,374,564) divulges a process for obtaining a thin silicon layer on a support to supply an SOI type substrate. The process includes a first step consisting of implanting a silicon substrate or an initial substrate by ions, for example hydrogen ions, to obtain a weakened zone delimiting a thin layer of silicon from the substrate implantation face. During a second step, a stiffener or final substrate is bonded on the implanted face of the initial substrate. The third step consists of separating the resulting stacked structure at the weakened zone. Separation produces a thin silicon layer transferred on a support, the remainder of the initial substrate being reusable. This process is known particularly under the name Smart Cut®.

This process is used to make a stacked structure by bonding, for example by molecular bonding, supporting a monocrystalline or polycrystalline thin layer. It gives very good results to obtain transfers of layers as thin as 0.1 μm. However, problems can arise when trying to obtain very thin layers (typically less than 0.1 μm) due to the appearance of defects, for example blisters, starting from the bonding interface.

One solution for obtaining very thin layers is to firstly obtain a thicker thin layer and then to remove the surplus material until the required thickness is obtained. However, excessive removal using conventional techniques (chemical mechanical polishing CMP, heat treatment, chemical etching, ionic etching, etc.), reduces the homogeneity of the thin layer. This degradation is more marked when the thickness to be removed is greater. Therefore quality, measured in terms of homogeneity of the thickness of the transferred layer, is degraded compared with what can be obtained using the Smart Cut® process.

Another problem occurs when the materials from which the layers to be thinned have properties that make CMP thinning difficult. This is the case for example for excessively hard materials such as sapphire, SiC, diamond. This is also the case for structures in which bonding used for stacking makes it impossible to use such techniques. For example, CMP and wet chemical etchings are unusable when the bonding energy is too low.

The pure exfoliation method, for example generated by implantation and by heat treatment at high temperature and without stiffener (approach described in American U.S. Pat. No. 6,103,599) can leave a roughness that is too great to be recoverable by CMP, hydrogen annealing or any other known surface treatment. Thus, the burst blisters phenomenon (exfoliation) can leave morphologies that are very difficult to remove on the surface. These burst blisters can be compared with sequences of steps at low frequencies (typical widths of the order of a few tens of μm).

PRESENTATION OF THE INVENTION

It is proposed to overcome this problem by using a process in which a relatively thick layer of material to be transferred is transferred onto the required support, and it is then thinned by implantation and assisted fracture due to the presence of an additional layer fixed to this thick layer. The result is a very thin good quality layer on said support.

Therefore, the purpose of the invention is a process for obtaining a thin layer made of a first material on a substrate made of a second material called the final substrate, including the following steps:

bonding a thick layer of a first material on one of its main faces on the final substrate at an interface, implantation of gaseous species in the thick layer of first material to create a weakened zone delimiting said thin layer between the interface and the weakened zone, deposit a layer of third material called the self-supporting layer on the free face of the thick layer made of first material, fracture within the structure composed of the final substrate, the thick layer of first material and the layer of third material, at the weakened zone to supply the substrate supporting said thin layer.

The result is a layer that is very thin in comparison with the orders of magnitudes of layers conventionally transferred using the Smart Cut® process, without a problem of bubbles at the interface and with good thickness uniformity.

Gaseous species may be implanted in the thick layer of first material by one or several implantations of identical or different gaseous species chosen from among species for example such as hydrogen or helium.

The thick layer of first material may be composed of one or several materials. It may be a layer delimited in an initial substrate during a gaseous species implantation step in order to create a weakened zone in the initial substrate, a fracture step between the thick layer of first material and the remainder of the initial substrate being made after the step to bond the thick layer of first material on the final substrate.

The implantation of gaseous species in the initial substrate may be an implantation of hydrogen ions.

According to a first embodiment, the step to implant gaseous species in the thick layer of first material is done after the fracture between the thick layer of first material and the remainder of the initial substrate.

According to a second embodiment, the step to implant gaseous species in the thick layer of first material is done before the step to bond the thick layer of first material onto the final substrate. In general, implantations are done such that the first fracture (in the initial substrate) does not hinder the second fracture (within the thick layer). For example, if the fracture steps are done by heat treatment, the steps to implant gaseous species are done under conditions such that the fracture between the thick layer of first material and the remainder of the initial substrate is obtained at a temperature less than the fracture temperature of said structure.

Advantageously, the self-supporting layer is fixed on the thick layer of first material by deposition of said third material on the thick layer of first material.

The thick layer of first material may be bonded onto the final substrate by molecular bonding.

According to one variant embodiment, part of the self-supporting layer is deposited and the gaseous species are implanted in the thick layer of first material after this partial deposit.

BRIEF DESCRIPTION OF THE DRAWINGS

The invention will be better understood and other advantages and features will become clear after reading the following description given as a non-limitative example accompanied by the attached drawings among which.

DETAILED PRESENTATION OF PARTICULAR EMBODIMENTS

FIGS. 1A to 1F illustrate a first embodiment of the process according to the invention to obtain a thin layer of silicon on a support. Obviously, the described technique may be applied to materials other than silicon for example such as SiC, germanium, III-V and IV-IV materials, nitrides (such as GaN) or other crystalline materials, these materials being used alone or in combination.

Figure 1A:
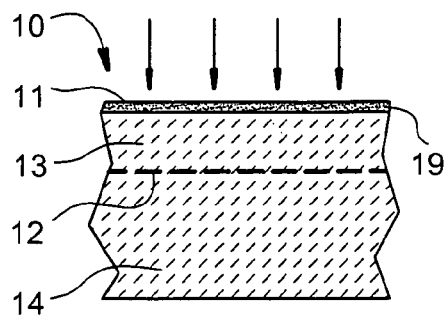
FIGS. 1A to 1F are cross-sectional views illustrating a first embodiment of the process according to the invention.

FIG. 1A shows an initial substrate made of silicon 10 comprising an oxide layer 19 on the surface, typically about 0.05 μm thick, in which one of the main faces, the oxidised face 11 is subjected to uniform ioning bombardment in order to create a weakened zone 12 at a determined distance from the face 11. The implantation is done using accelerated high energy hydrogen ions (for example 210 keV) so that the created weakened zone 12 is fairly deep from the bombarded face 11. Thus, a layer 13 with a thickness of about 1.9 μm is delimited between the face 11 and the weakened zone 12, the remainder of the initial substrate being marked with reference 14. The layer 13 may be called the thick layer. The dose of implanted ions is chosen according to the Smart Cut® process to subsequently obtain a fracture at the weakened zone, for example by heat treatment. The heat treatment may be assisted or replaced by a mechanical treatment. We will use the term heat treatment alone in the remainder of this description for simplification reasons.

Figure 1B:
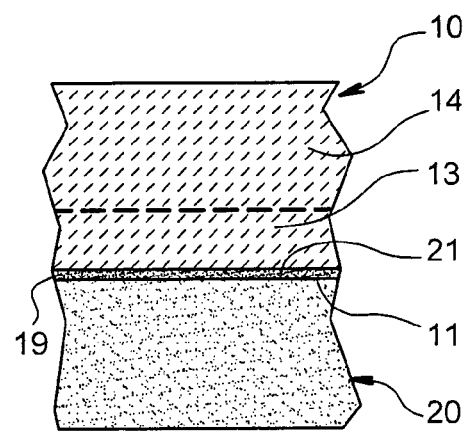
Figure 1C:
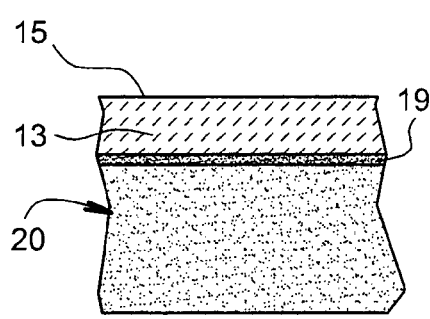

FIG. 1B shows fixation of the face 11 of the initial substrate 10 on a face 21 of the final substrate 20. For example, fixation is obtained by molecular bonding.

The structure obtained is then subjected to heat treatment at a temperature of about 480° C. This heat treatment causes a fracture of the structure at the weakened zone. After removal of the remainder 14 of the initial substrate, the result is the stacked structure shown in FIG. 1C including the final substrate 20 to which the 1.9 μm thick layer 13 is bonded. The thick layer 13 has a free face 15.

The structure may also be subjected to a heat treatment to reinforce its bonding interface. For example, such a heat treatment will be done at about 1100° C. for about 2 hours.

A surface treatment may be applied to the face 15 (by CMP, hydrogen annealing, etc.) in order to eliminate roughness. For example, if CMP is used to reduce the thickness by the order of 50 nm, a good uniformity in the thickness of the thick layer can be maintained.

One variant could consist of depositing or thermally generating a thin layer of oxide, for example of the order of 0.2 μm thick.

Figure 1D:
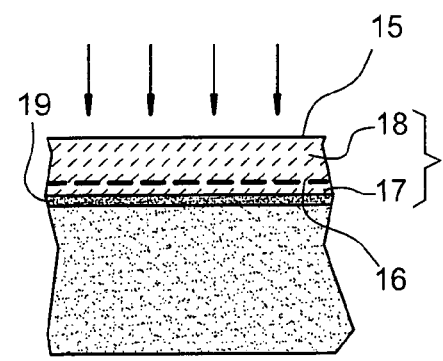

A second ionic implantation is then made, for example by hydrogen ions. This is shown in FIG. 1D. For example, the implantation energy used may be 185 keV and the ion dose is chosen to subsequently obtain a fracture at the weakened zone thus obtained, for example by heat treatment. The weakened zone 16 is at a depth of about 1.5 μm from the face 15. It separates the thick layer 13 into two sub-layers 17 and 18, the sub-layer 17 forming the required thin layer.

Figure 1E:
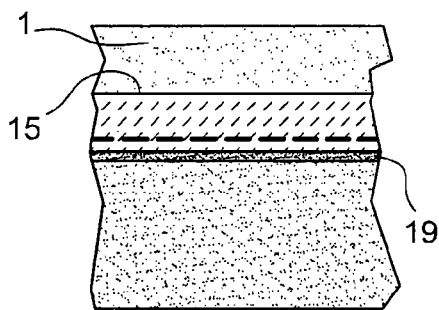

The next step is to deposit a layer 1 called the self-supporting layer on the face 15, as shown in FIG. 1E. It may be a layer of silicon oxide, 4 μm thick, deposited by PECVD.

If a thin layer of oxide was deposited or generated before the second implantation, this layer will be completed here.

Figure 1F:
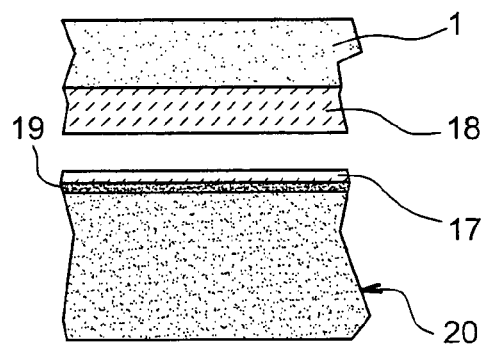

A heat treatment can then be applied to obtain the fracture, for example an isothermal annealing at 600° C. This is shown in FIG. 1F. The structure is separated into a first part composed of a self-supported dual layer, comprising the self-supporting layer 1 and the sub-layer 18, and a second part composed of the final substrate 20 to which the thin layer 17 is bonded through the oxide layer 19. The dual layer could be reusable.

The final substrate 20 and the thin layer 17 can then be subjected to a cleaning step, conventional steps to thin and stabilise the thin layer, illustrated for example in document FR-A-2 777 115, in order and in the current optimum combination. The thin silicon layer may then be approximately 100 nm thick.

The final substrate used may have various natures. It may be made of a semi-conducting material or an insulating material, or it may be composed of a stack (for example a silicon substrate covered by a layer of silicon oxide).

FIGS. 2A to 2F illustrate a second embodiment of the process according to the invention to obtain a thin silicon layer on a support.

Figure 2A:
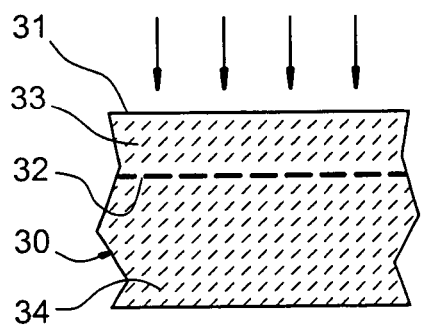
FIGS. 2A to 2F are cross-sectional views illustrating a second embodiment of the process according to the invention.

FIG. 2A shows an initial silicon substrate 30 for which one of the main faces, face 31, is subjected to uniform ionic bombardment in order to create a weakened zone 32 at a determined distance from the face 31. This face could also be provided with an oxide layer, for example a few nanometers thick. As for the first embodiment of the invention, the implantation may be done by hydrogen ions with an energy of 210 keV. The implantation delimits a thick layer 33 with a thickness of close to 1.9 μm between the face 31 and the weakened zone 32. The remainder of the initial substrate is marked with reference 34.

Figure 2B:
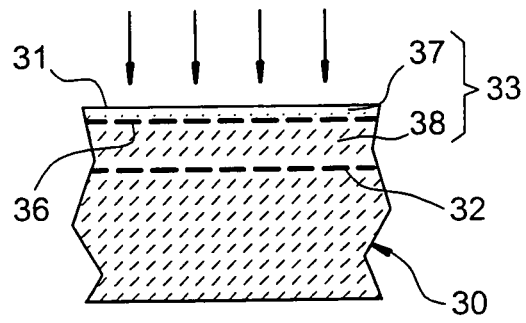

The next step shown in FIG. 2B consists of making a second ionic implantation through the face 31. This second implantation is not as deep as the first and the dose is lower. The implantation energy may be of the order of 50 keV. It is used to create a weakened zone 36 inside the thick layer 33. The weakened zone 36 delimits a thin layer 37 from the face 31. The remainder of the thick layer 33 or the sub-layer is marked as reference 38.

Figure 2C:
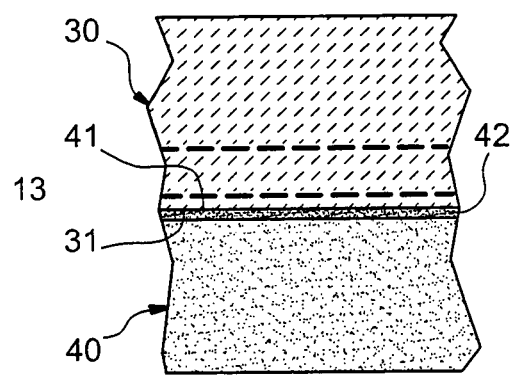

FIG. 2C shows fixation of the face 31 of the initial substrate 30 onto a face 41 of the final substrate 40 comprising an oxide layer 42 on the surface, typically 0.05 μm thick. Fixation may be obtained by molecular bonding.

Figure 2D:
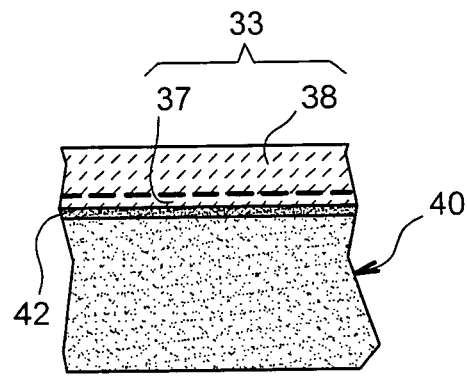

The structure obtained may then be heat treated at a relatively low temperature, for example 430° C., to obtain a fracture at the first weakened zone, in other words zone 32. Implantation conditions of the two weakened zones were selected so as to not generate a fracture, or even exfoliation, in the second weakened zone. The advantage of having done the second implantation before the thick layer is transferred is that as a result, this second implantation is not as deep and is done through a normally good quality surface (better than the quality of a face obtained by fracture). Therefore, the result is a thinner weakened zone, and therefore with a lower roughness after final fracture. The structure obtained is shown in FIG. 2D.

At this stage of the process, the surface treatment step may be eliminated since a self-supporting layer can be deposited directly. However, a minimum surface treatment may be done to eliminate all or part of the roughness. It may be done by CMP, or annealing for example under hydrogen or any other compatible atmosphere known to those skilled in the art, wet chemical etching or ionic etching. The surface treatment enables removal of a few nm to a few tens of nm, thus maintaining good uniformity of thickness. For a self-supporting layer made of $SiO_2$, this minimum surface treatment enables an only slightly rough buried Si—$SiO_2$ interface.

Figure 2E:
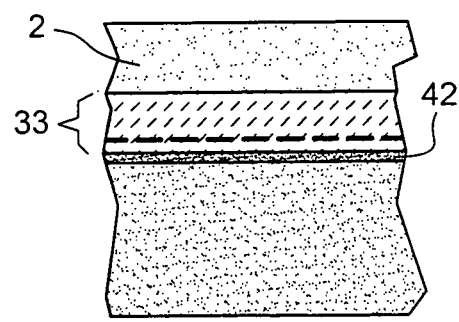

The next step is to make a deposit of a layer 2 called a self-supporting layer on the thick layer 33, as shown in FIG. 2E. As mentioned above, it may be a 4 µm thick silicon oxide layer deposited by PECVD.

Figure 2F:
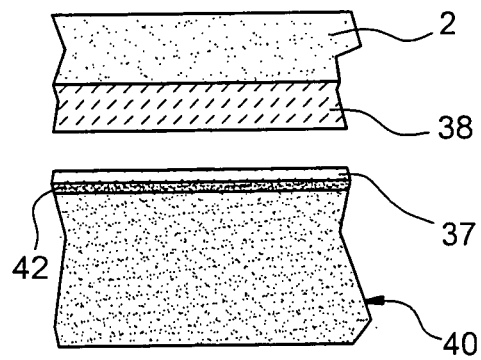

A heat treatment can then be applied, for example isothermal annealing at 600° C., to obtain the fracture as shown in FIG. 2F. The structure is separated into a first part composed of a self-supported dual layer comprising the self-supporting layer 2 and the sub-layer 38, and a second part comprising the final substrate 40 to which the thin layer 37 is bonded by means of the oxide layer 42. The dual layer could be reusable.

As described above, the cleaning and finishing steps may be performed on the resulting stacked structure.

These two embodiments suggest that some steps may be combined and/or inverted. For example, all or part of the self-supporting layer can be deposited and the second implantation can be done after this deposit. In this case, the implantation energy is corrected to take account of it.

The self-supported layer may be a silicon oxide or it may be made of other materials, for example such as $Si_3N_4$, $SiO_x$, $Si_xN_y$, $Si_xN_yO_z$, $Al_2O_3$, SiC, sapphire, diamond, etc.

The thickness of the self-supported layer may be selected by experiment. In the case of a self-supported $SiO_2$ layer deposited on a silicon thick layer, the following experiment was done to evaluate the effect of the deposited oxide thickness on the annealing temperature, thickness necessary to obtain the fracture of the self-supported silicon layer. The implantation conditions were implantation energy 76 keV, implantation dose $6 \times 10^{16}$ $H^+$ions/$cm^2$ through a 400 nm thick $SiO_2$ protective film.

Figure 3:
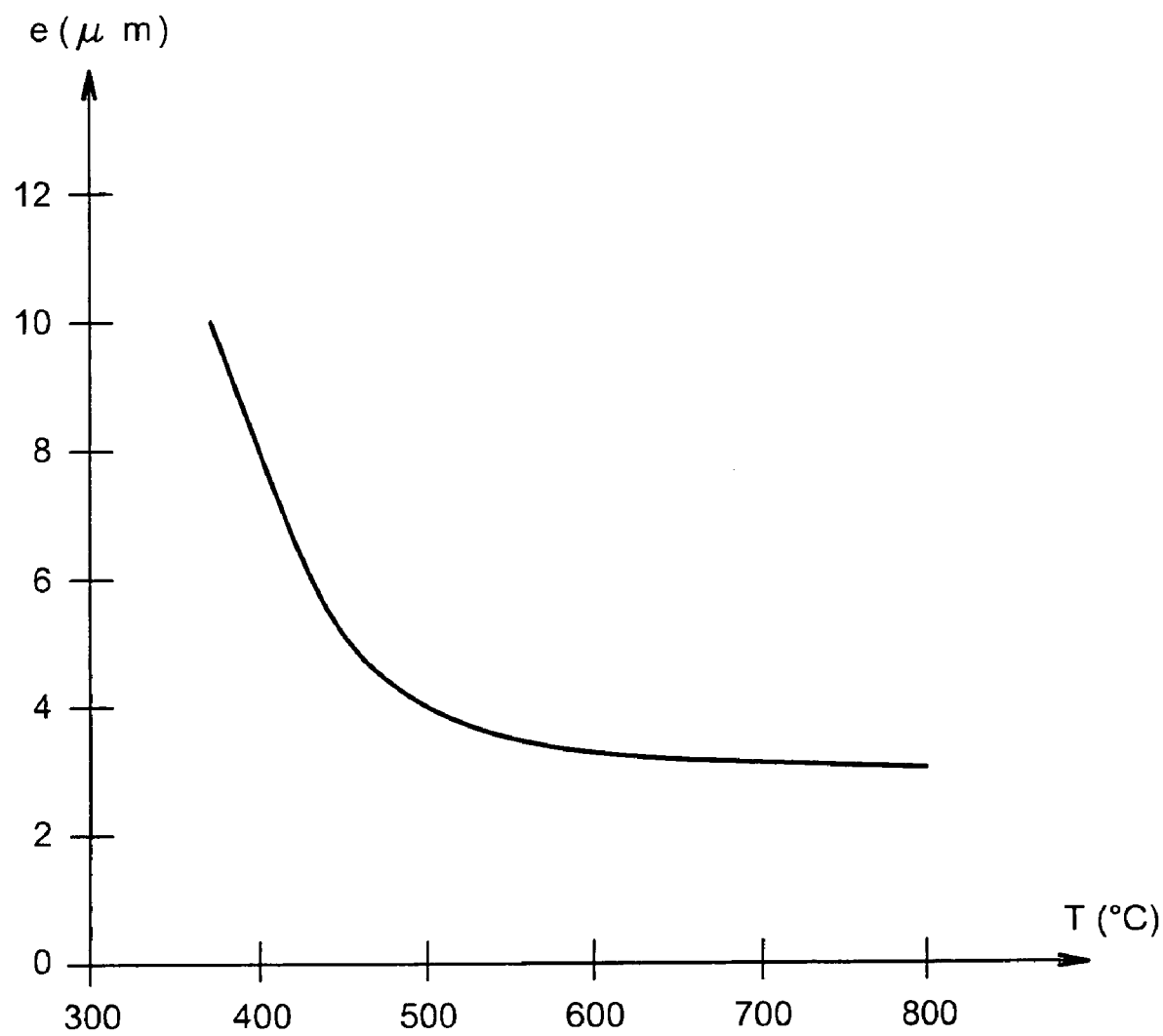
FIG. 3 is an explanatory diagram.

FIG. 3 is a diagram in which the ordinate represents the thickness e of the $SiO_2$ deposit and the abscissa represents the annealing temperature T. The curve shown in this diagram delimits the area in which the self-supported silicon layer is transferred (the area located above the curve) from the area in which a "blister" occurs on the silicon layer (the zone located below the curve).

This diagram shows that the temperature of separation (or fracture) with transfer of a self-supported dual layer does depend on the deposited oxide thickness. The temperature is higher if the oxide is thinner. Consequently, the thickness of the fractured silicon layer needs to be added to this oxide thickness. Therefore, in particular it is possible to deduce the minimum thickness of oxide layer necessary for the fracture to be induced at a certain temperature. Therefore, it can be seen that the "threshold" fracture thickness at 600° C. is exceeded for 4 µm of deposited oxide.

Therefore, it is possible to control the thinning procedure by controlling the thickness of the deposited self-supporting layer, thus preventing "blistering" and exfoliation phenomena that would occur if the deposited layer is thinner than the "threshold" thickness.

The invention claimed is:

1. A process for obtaining a thin layer made of a first material on a substrate made of a second material called a final substrate, the process comprising, in the order as hereinafter set forth:

bonding a thick layer of a first material by one of its main faces on the final substrate at an interface followed by implanting gaseous species in the thick layer of the first material to create a weakened zone delimiting said thin layer between the interface and the weakened zone, or implanting gaseous species in a thick layer of a first material to create a weakened zone followed by bonding said thick layer of said first material by one of its main faces on the final substrate at an interface thereby delimiting said thin layer between the interface and the weakened zone;

depositing a layer of a third material to form a self-supporting layer on a free face of the thick layer made of the first material; and fracturing the structure comprising the final substrate, the thick layer of the first material and the layer of the third material at the weakened zone to supply the substrate supporting said thin layer.

2. The process according to claim 1, wherein implanting gaseous species further comprises implanting one or more identical or different gaseous species.

3. The process according to claim 2, wherein said gaseous species are selected from the group consisting of hydrogen and helium.

4. The process according to claim 2, wherein said gaseous species are selected from the group consisting of hydrogen and helium.

5. The process according to claim 1, wherein the thick layer of the first material is bonded onto the final substrate by molecular bonding.

6. The process according to claim 1, wherein a part of the self-supporting layer is deposited, and the gaseous species are implanted in the thick layer of the first material after the partial deposit.

7. The process according to claim 1, wherein said thin layer has a thickness less than 0.1 µm.

8. The process according to claim 1, comprising, in the order as hereinafter set forth:

bonding a thick layer of a first material by one of its main faces on the final substrate at an interface followed by implanting gaseous species in the thick layer of the first material to create a weakened zone delimiting said thin layer between the interface and the weakened zone;

depositing a layer of a third material to form a self-supporting layer on a free face of the thick layer made of the first material; and fracturing the structure comprising the final substrate, the thick layer of the first material and the layer of the third material at the weakened zone to supply the substrate supporting said thin layer.

9. The process according to claim 8, wherein implanting gaseous species further comprises implanting one or more identical or different gaseous species.

10. The process according to claim 9, wherein said gaseous species are selected from the group consisting of hydrogen and helium.

11. The process according to claim 1, comprising, in the order as hereinafter set forth:

implanting gaseous species in a thick layer of a first material to create a weakened zone followed by bonding said thick layer of said first material by one of its main faces on the final substrate at an interface thereby delimiting said thin layer between the interface and the weakened zone;

depositing a layer of a third material to form a self-supporting layer on a free face of the thick layer made of the first material; and fracturing the structure comprising the final substrate, the thick layer of the first material and the layer of the third material at the weakened zone to supply the substrate supporting said thin layer.

12. The process according to claim 11, wherein implanting gaseous species further comprises implanting one or more identical or different gaseous species.

13. The process according to claim 1, consisting of, in the order as hereinafter set forth:

bonding a thick layer of a first material by one of its main faces on the final substrate at an interface followed by implanting gaseous species in the thick layer of the first material to create a weakened zone delimiting said thin layer between the interface and the weakened zone;

depositing a layer of a third material to form a self-supporting layer on a free face of the thick layer made of the first material; and fracturing the structure comprising the final substrate, the thick layer of the first material and the layer of the third material at the weakened zone to supply the substrate supporting said thin layer.

14. The process according to claim 1, consisting of, in the order as hereinafter set forth:

implanting gaseous species in a thick layer of a first material to create a weakened zone followed by bonding said thick layer of said first material by one of its main faces on the final substrate at an interface thereby delimiting said thin layer between the interface and the weakened zone;

depositing a layer of a third material to form a self-supporting layer on a free face of the thick layer made of the first material; and fracturing the structure comprising the final substrate, the thick layer of the first material and the layer of the third material at the weakened zone to supply the substrate supporting said thin layer.

15. A process for obtaining a thin layer made of a first material on a substrate made of a second material called a final substrate, the process comprising:

bonding a thick layer of a first material by one of its main faces on the final substrate at an interface;

followed by implanting gaseous species in the thick layer of the first material to create a weakened zone delimiting said thin layer between the interface and the weakened zone;

followed by depositing a layer of a third material called a self-supporting layer on a free face of the thick layer made of the first material; and fracturing within the structure composed of the final substrate, the thick layer of the first material and the layer of the third material, at the weakened zone to supply the substrate supporting said thin layer, wherein the thick layer of the first material is a layer delimited in an initial substrate when implanting a gaseous species to create a weakened zone in the initial substrate, and further comprising fracturing between the thick layer of the first material and a remainder of the initial substrate, which is performed after bonding the thick layer of the first material onto the final substrate.

16. The process according to claim 15, wherein implanting gaseous species in the initial substrate further comprises implanting hydrogen ions.

17. The process according to claim 15, wherein implanting gaseous species in the thick layer of the first material is performed after fracturing between the thick layer of the first material and a remainder of the initial substrate.

18. The process according to claim 15, wherein implanting gaseous species in the thick layer of first material is performed before bonding the thick layer of the first material on the final substrate.

19. The process according to claim 18, wherein fracturing is performed by a heat treatment, wherein implanting gaseous species is performed under conditions so that the fracturing between the thick layer of the first material and a remainder of the initial substrate is obtained at a temperature less than the fracture temperature of said structure.

20. The process according to claim 15, wherein said thin layer has a thickness less than 0.1 µm.

* * * * *